US009455692B2

(12) United States Patent
Ok

(10) Patent No.: US 9,455,692 B2
(45) Date of Patent: Sep. 27, 2016

(54) SEMICONDUCTOR DEVICE AND SEMICONDUCTOR SYSTEM INCLUDING THE SAME

(71) Applicant: SK hynix Inc., Icheon-si Gyeonggi-do (KR)

(72) Inventor: Seung Han Ok, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/715,796

(22) Filed: May 19, 2015

(65) Prior Publication Data

US 2016/0182025 A1    Jun. 23, 2016

(30) Foreign Application Priority Data

Dec. 23, 2014    (KR) .......................... 10-2014-0187493

(51) Int. Cl.
*H03K 5/08*    (2006.01)
*H03K 19/0175*    (2006.01)

(52) U.S. Cl.
CPC ........ *H03K 5/08* (2013.01); *H03K 19/017509* (2013.01)

(58) Field of Classification Search
USPC ....................................................... 327/309
See application file for complete search history.

(56) References Cited

U.S. PATENT DOCUMENTS

| 8,368,006 | B2* | 2/2013 | Chikaoka | ............. | G02B 26/101 250/234 |
| 2002/0140468 | A1 | 10/2002 | Kato et al. | | |
| 2014/0062546 | A1* | 3/2014 | Chi | ...................... | H03H 11/265 327/142 |
| 2014/0169064 | A1* | 6/2014 | Choi | ...................... | G11C 5/147 365/148 |
| 2014/0368180 | A1* | 12/2014 | Ok | .......................... | G05F 3/262 323/315 |

FOREIGN PATENT DOCUMENTS

KR    1020140033578 A    3/2014

\* cited by examiner

*Primary Examiner* — Lincoln Donovan
*Assistant Examiner* — Patrick Chen
(74) *Attorney, Agent, or Firm* — William Park & Associates Ltd.

(57) ABSTRACT

A semiconductor device may include a control signal generation block configured to shift a level of a trimming signal and generate a selection control signal, and shift a level of a first enable signal and generate a driving control signal, when an internal voltage is raised to a level greater than a sensing reference voltage after an initialization period is ended. The semiconductor device may include an internal voltage generation block configured to select one of a plurality of trimming division voltages as a selected reference voltage in response to the selection control signal, and drive the internal voltage by comparing levels of the selected reference voltage and the internal voltage in response to the driving control signal.

25 Claims, 7 Drawing Sheets

US 9,455,692 B2

SEMICONDUCTOR DEVICE AND SEMICONDUCTOR SYSTEM INCLUDING THE SAME

CROSS-REFERENCE TO RELATED APPLICATION

The present application claims priority under 35 U.S.C. §119(a) to Korean application number 10-2014-0187493, filed on Dec. 23, 2014, in the Korean Intellectual Property Office, which is incorporated herein by reference in its entirety.

BACKGROUND

1. Technical Field

Embodiments of the present disclosure generally relate to a semiconductor system including a semiconductor device, and more particularly, to a semiconductor system generating an internal voltage.

2. Related Art

In general, a semiconductor device is supplied with a power supply voltage (VDD) exteriorly from the semiconductor device. The semiconductor device is supplied with a ground voltage (VSS) from an exterior as well. With the power supply (VDD) voltage and ground voltage (VSS), the semiconductor device generates and uses internal voltages necessary for internal operations. Voltages necessary for the internal operations of a semiconductor device include a core voltage (VCORE), a boost voltage (VPP), and a back bias voltage (VBB). The core voltage (VCORE) is supplied to a memory core region. The boost voltage (VPP) is used for driving a word line or during overdriving. The back bias voltage (VBB) is supplied as the bulk voltage of an NMOS transistor in a core region.

The core voltage (VCORE) may be supplied at a predetermined level by reducing the power supply voltage (VDD) received from the exterior. However, the boost voltage (VPP) has a level higher than the power supply voltage (VDD) inputted from the exterior, and the back bias voltage (VBB) retains a level lower than the ground voltage (VSS) inputted from the exterior. Therefore, a charge pump circuit is needed to supply charges for the boost voltage (VPP) and the back bias voltage (VBB).

SUMMARY

In an embodiment, a semiconductor device may include a control signal generation block configured to shift a level of a trimming signal and generate a selection control signal, and shift a level of a first enable signal and generate a driving control signal, when an internal voltage is raised to a level higher than a sensing reference voltage after an initialization period is ended. The semiconductor device may include an internal voltage generation block configured to select one of a plurality of trimming division voltages as a selected reference voltage in response to the selection control signal, and drive the internal voltage by comparing levels of the selected reference voltage and the internal voltage in response to the driving control signal.

In an embodiment, a semiconductor system may include a first semiconductor device configured to output a power supply voltage and a test enable signal. The semiconductor system may include a second semiconductor device configured to be supplied with the power supply voltage, shift a level of a trimming signal and generate a selection control signal and shift a level of a first enable signal and generate a driving control signal when an internal voltage is raised to a level higher than a sensing reference voltage after an initialization period is ended, select one of a plurality of trimming division voltages as a selected reference voltage in response to the selection control signal, and compare levels of the selected reference voltage and the internal voltage in response to the driving control signal and drive the internal voltage.

In an embodiment, a semiconductor system may include a first semiconductor device configured to output a power supply voltage, and a second semiconductor device configured to output a test enable signal. The semiconductor system may include a third semiconductor device configured to be supplied with the power supply voltage, shift a level of a trimming signal and generate a selection control signal and shift a level of a first enable signal and generate a driving control signal when an internal voltage is raised to a level higher than a sensing reference voltage after an initialization period is ended, select one of a plurality of trimming division voltages as a selected reference voltage in response to the selection control signal, and compare levels of the selected reference voltage and the internal voltage in response to the driving control signal and drive the internal voltage.

DETAILED DESCRIPTION

Hereinafter, a semiconductor device and a semiconductor system including the same will be described below with reference to the accompanying drawings through various examples of embodiments.

Various embodiments may be directed to a semiconductor system including a semiconductor device capable of stably generating an internal voltage.

Figure 1:
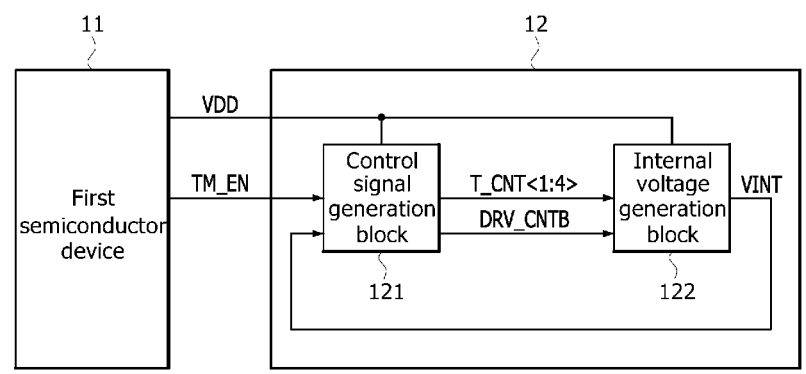
FIG. 1 is a block diagram illustrating a representation of an example of the configuration of a semiconductor system in accordance with an embodiment.

Referring to FIG. 1, a semiconductor system in accordance with an embodiment may include a first semiconductor device 11 and a second semiconductor device 12. The first semiconductor device 11 may apply a power supply voltage VDD to the second semiconductor device 12. The first semiconductor device 11 may apply a test enable signal TM_EN to the second semiconductor device 12. The second semiconductor device 12 may include a control signal generation block 121. The second semiconductor device 12 may include an internal voltage generation block 122. The control signal generation block 121 may operate by being supplied with the power supply voltage VDD. The control signal generation block 121 may generate first to fourth selection control signals T_CNT<1:4> and a driving control signal DRV_CNTB when, for example, an internal voltage VINT is raised to a level higher than a preset level after the end of an initialization period. The initialization period may be set to a period from when the power supply voltage VDD starts to be supplied to the second semiconductor device 12 and is gradually raised from 0V to until the power supply voltage VDD is raised to a preset initial level. The internal voltage generation block 122 may operate by being supplied with the power supply voltage VDD. The internal voltage generation block 122 may drive the internal voltage VINT in response to the first to fourth selection control signals T_CNT<1:4> and the driving control signal DRV_CNTB.

Figure 2:
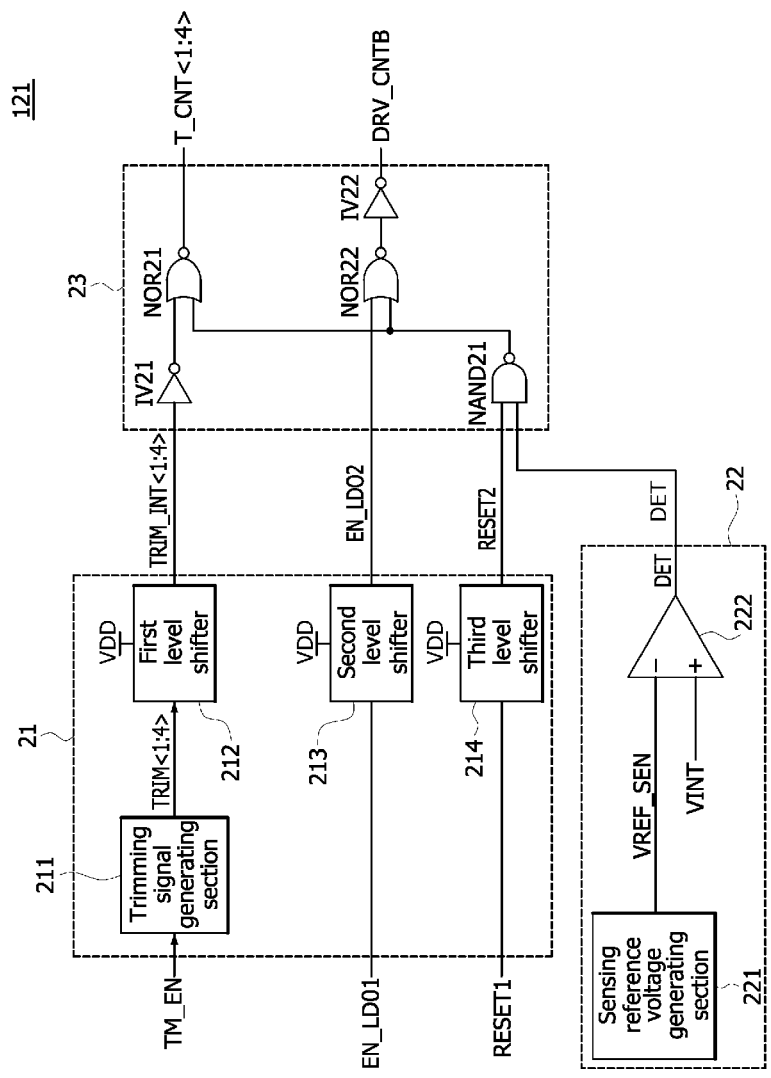
FIG. 2 is a circuit diagram illustrating a representation of an embodiment of the control signal generation block included in the semiconductor system illustrated in FIG. 1.

Referring to FIG. 2, the control signal generation block 121 may include an internal signal generation unit 21, a detection signal generation unit 22, and a control signal output unit 23.

The internal signal generation unit 21 may include a trimming signal generating section 211, and a first level shifter 212. The internal signal generation unit 21 may include a second level shifter 213, and a third level shifter 214. The trimming signal generating section 211 may include a fuse array (not illustrated) including a plurality of fuses. Whether to cut the fuses included in the fuse array may be set in advance to control the driving condition of the internal voltage VINT. The trimming signal generating section 211 may generate first to fourth trimming signals TRIM<1:4>. The logic level combination of the first to fourth trimming signals TRIM<1:4> may be set according to whether the fuses included in the fuse array are cut or not when the test enable signal TM_EN is enabled (or at a predetermined level). The first level shifter 212 may be supplied with the power supply voltage VDD. The first level shifter 212 may shift the levels of the first to fourth trimming signals TRIM<1:4>. The first level shifter 212 may generate first to fourth internal trimming signals TRIM_INT<1:4>. The second level shifter 213 may be supplied with the power supply voltage VDD. The second level shifter 213 may shift the level of a first enable signal EN_LDO1. The second level shifter 213 may generate a second enable signal EN_LDO2. The first enable signal EN_LDO1 may be enabled when internal operations using the internal voltage VINT, for example, operations such as an active operation, a read operation, a write operation and a refresh operation, are performed. The third level shifter 214 may be supplied with the power supply voltage VDD. The third level shifter 214 may shift the level of a first reset signal RESET1. The third level shifter 214 may generate a second reset signal RESET2. The first reset signal RESET1 may be set to be enabled after the initialization period is ended. Logic levels at which the first enable signal EN_LDO1 and the first reset signal RESET1 are enabled may be set variously according to the various embodiments. The logic levels of the first to fourth internal trimming signals TRIM_INT<1:4>, the second enable signal EN_LDO2 and the second reset signal RESET2, all generated through level shifting, may be set to swing between the power supply voltage VDD and a ground voltage VSS.

The detection signal generation unit 22 may include a sensing reference voltage generating section 221 and a comparator 222. The sensing reference voltage generating section 221 may be realized by, for example but not limited to, a Widlar circuit or the like, and may generate a sensing reference voltage VREF_SEN. The sensing reference voltage VREF_SEN may have a stable logic level even with a variation in PVT (process, voltage and temperature). The comparator 222 may be configured to compare the levels of the sensing reference voltage VREF_SEN and the internal voltage VINT, and may generate a detection signal DET. The detection signal DET may be enabled to a logic high level in the example where the internal voltage VINT has a level higher than the sensing reference voltage VREF_SEN. The detection signal DET may be disabled to a logic low level in the example where the internal voltage VINT has a level lower than the sensing reference voltage VREF_SEN.

The control signal output unit 23 may include, for example, inverters IV21 and IV22, NOR gates NOR21 and NOR22, and a NAND gate NAND21. The control signal output unit 23 may be inputted with the first to fourth internal trimming signals TRIM_INT<1:4>, the second enable signal EN_LDO2, the second reset signal RESET2, and the detection signal DET. The control signal output unit 23 may generate the first to fourth selection control signals T_CNT<1:4> and the driving control signal DRV_CNTB. The control signal generation unit 23 may generate the first to fourth selection control signals T_CNT<1:4> and the driving control signal DRV_CNTB, by buffering the first to fourth internal trimming signals TRIM_INT<1:4> and the second enable signal EN_LDO2 in response to the second reset signal RESET2 and the detection signal DET both enabled to logic high levels, in the example where the internal voltage VINT is raised to a level higher than the preset level of the sensing reference voltage VREF_SEN after the end of the initialization period.

Figure 3:
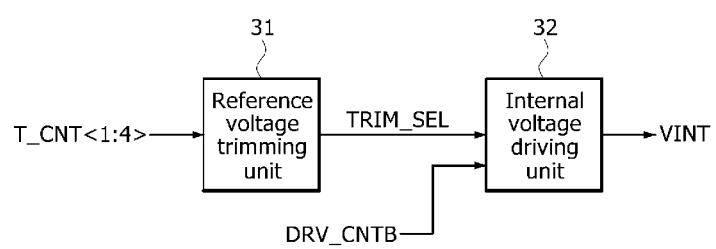
FIG. 3 is a circuit diagram illustrating a representation of an embodiment of the internal voltage generation block included in the semiconductor system illustrated in FIG. 1.

Referring to FIG. 3, the internal voltage generation block 122 may include a reference voltage trimming unit 31 and an internal voltage driving unit 32. The reference voltage trimming unit 31 may generate a selected reference voltage TRIM_SEL. The level of the selected reference voltage TRIM_SEL may be trimmed, in response to the first to fourth selection control signals T_CNT<1:4>. The internal voltage driving unit 32 may compare the levels of the selected reference voltage TRIM_SEL and the internal voltage VINT in the example where the enabled driving control signal DRV_CNTB is inputted, and drive the internal voltage VINT.

Figure 4:
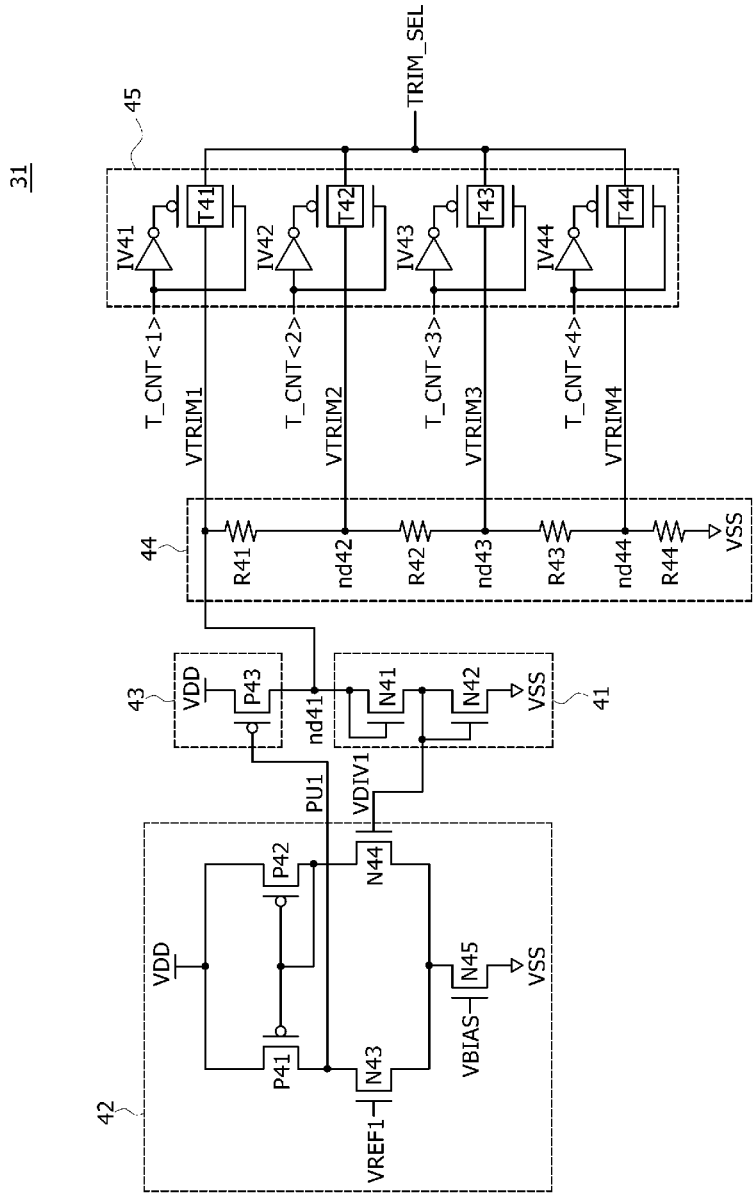
FIG. 4 is a circuit diagram illustrating a representation of an embodiment of the reference voltage trimming unit included in the internal voltage generation block illustrated in FIG. 3.

Referring to FIG. 4, the reference voltage trimming unit 31 may include a first voltage dividing section 41, a first driving signal generating section 42, and a first driving section 43. The reference voltage trimming unit 31 may include a trimming division voltage generating section 44, and a reference voltage selecting section 45. The first voltage dividing section 41 may include NMOS transistors N41 and N42. The first voltage dividing section 41 may divide the voltage level of an internal node nd41. The NMOS transistors N41 and N42 may be coupled between the internal node nd41 and a ground voltage VSS terminal. The first voltage dividing section 41 may generate a first divided voltage VDIV1. The first driving signal generating section 42 may include PMOS transistors P41 and P42 and NMOS transistors N43, N44 and N45. The first driving signal generating section 42 may be supplied with the power supply voltage VDD, and may be coupled to a ground voltage VSS. The PMOS transistors P41 and P42 may form current mirrors configured to operate as a constant current source. The NMOS transistors N43 and N44 may be turned on by being respectively inputted with a first reference voltage VREF1 and the first divided voltage VDIV1. The NMOS transistor N45 may be turned on by being inputted with a bias voltage VBIAS. The first driving signal generating section 42 may generate a first pull-up signal PU1. The first pull-up signal PU1 may be enabled to a logic low level when, for example, the first divided voltage VDIV1 has a level lower than the first reference voltage VREF1. The first driving section 43 may include a PMOS transistor P43, and pull-up drive the internal node nd41 with the power supply voltage VDD when, for example, the first pull-up signal PU1 received is enabled to the logic low level. The trimming division voltage generating section 44 may include resistor elements R41, R42, R43 and R44. The resistor elements R41, R42, R43 and R44 are electrically coupled between the internal node nd41 and the ground voltage VSS. The trimming division voltage generating section 44 may divide a first trimming division voltage VTRIM1 outputted from the internal node nd41 and generate a second trimming division voltage VTRIM2, a third trimming division voltage VTRIM3 and a fourth trimming division voltage VTRIM4. The second trimming division voltage VTRIM2 may be outputted from a node nd42, the third trimming division voltage VTRIM3 may be outputted from a node nd43, and the fourth trimming division voltage VTRIM4 may be outputted from a node nd44. The reference voltage selecting section 45 may include inverters IV41, IV42, IV43 and IV44 and transfer gates T41, T42, T43 and T44. The reference voltage selecting section 45 may select and output the first trimming division voltage VTRIM1 as the selected reference voltage TRIM_SEL when, for example, the first selection control signal T_CNT<1> is enabled to a logic high level. The reference voltage selecting section 45 may select and output the second trimming division voltage VTRIM2 as the selected reference voltage TRIM_SEL when, for example, the second selection control signal T_CNT<2> is enabled to a logic high level. The reference voltage selecting section 45 may select and output the third trimming division voltage VTRIM3 as the selected reference voltage TRIM_SEL when, for example, the third selection control signal T_CNT<3> is enabled to a logic high level. The reference voltage selecting section 45 may select and output the fourth trimming division voltage VTRIM4 as the selected reference voltage TRIM_SEL when, for example, the fourth selection control signal T_CNT<4> is enabled to a logic high level.

Figure 5:
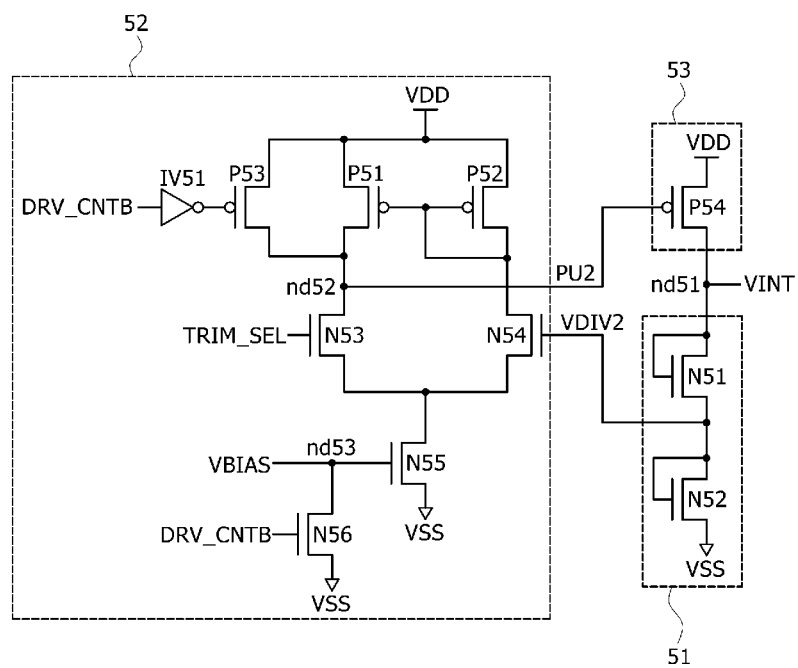
FIG. 5 is a circuit diagram illustrating a representation of an embodiment of the internal voltage driving unit included in the internal voltage generation block illustrated in FIG. 3.

Referring to FIG. 5, the internal voltage driving unit 32 may include a second voltage dividing section 51, a second driving signal generating section 52, and a second driving section 53. The second voltage dividing section 51 may include NMOS transistors N51 and N52. The second voltage dividing section 51 may be coupled between a node nd51 and a ground voltage VSS terminal. The second voltage dividing section 51 may divide the voltage level of an internal node nd51. The internal voltage VINT is outputted through the internal node nd51. The second voltage dividing section 51 may generate a second divided voltage VDIV2. The second driving signal generating section 52 may include PMOS transistors P51, P52 and P53, NMOS transistors N53, N54, N55 and N56, and an inverter IV51. The PMOS transistors P51 and P52 may form current mirrors configured to operate as a constant current source. The second driving signal generating section 52 may be supplied with the power supply voltage VDD. The PMOS transistor P53 may be turned on by being inputted with an inverted and buffered signal of the driving control signal DRV_CNTB through the inverter IV51. The NMOS transistors N53 and N54 may be turned on by being respectively inputted with the selected reference voltage TRIM_SEL and the second divided voltage VDIV2. The NMOS transistor N55 may be turned on by being inputted with the bias voltage VBIAS. The NMOS transistor N56 may pull-down drive a node nd53 with the ground voltage VSS, in response to the driving control signal DRV_CNTB. The bias voltage VBIAS may be inputted to the NMOS transistor N56 through the node nd53. The second driving signal generating section 52 may generate a second pull-up signal PU2 enabled to a logic low level when, for example, the second divided voltage VDIV2 has a level lower than the selected reference voltage TRIM_SEL in the state in which the driving control signal DRV_CNTB is enabled to a logic low level. The second driving section 53 may include a PMOS transistor P54, and pull-up drive the internal voltage VINT with the power supply voltage VDD when, for example, the second pull-up signal PU2 is enabled to the logic low level and inputted through a node nd52 of the second driving signal generation section 52.

In the semiconductor system configured as mentioned above, control is performed such that, in the example where the initialization period in which the power supply voltage VDD is raised to the preset initial level is ended and the internal voltage VINT is generated at a level higher than the preset level of the sensing reference voltage VREF_SEN, the internal voltage VINT may be trimmed by the first to fourth trimming signals TRIM<1:4>. Accordingly, in the semiconductor system in accordance with an embodiment, it may be possible to prevent the internal voltage VINT from being unstably trimmed by the first to fourth trimming signals TRIM<1:4> during the initialization period or at a low level of the internal voltage VINT.

Figure 6:
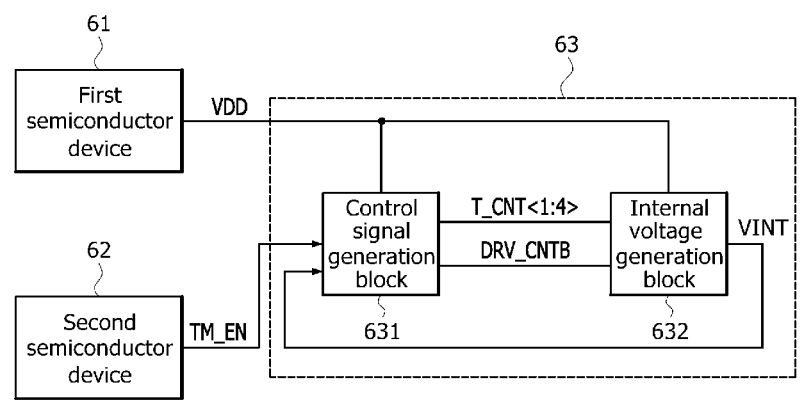
FIG. 6 is a block diagram illustrating a representation of an example of the configuration of a semiconductor system in accordance with an embodiment.

Referring to FIG. 6, a semiconductor system in accordance with an embodiment may include a first semiconductor device 61, a second semiconductor device 62, and a third semiconductor device 63. The first semiconductor device 61 may apply a power supply voltage VDD to the third semiconductor device 63. The second semiconductor device 62 may apply a test enable signal TM_EN to the third semiconductor device 63. The third semiconductor device 63 may include a control signal generation block 631 and an internal voltage generation block 632. The control signal generation block 631 may operate by being supplied with the power supply voltage VDD. The control signal generation block 631 may generate first to fourth selection control signals T_CNT<1:4> and a driving control signal DRV_CNTB when, for example, an internal voltage VINT is raised to a level higher than a preset level after the end of an initialization period. The initialization period may be set to a period from when the power supply voltage VDD is started to be supplied to the third semiconductor device 63 and be gradually raised from 0V to until the power supply voltage VDD is raised to a preset initial level. The internal voltage generation block 632 may operate by being supplied with the power supply voltage VDD. The internal voltage generation block 632 may drive the internal voltage VINT in response to the first to fourth selection control signals T_CNT<1:4> and the driving control signal DRV_CNTB. Since the semiconductor system illustrated in FIG. 6 is substantially the same as the semiconductor system illustrated in FIG. 1 except that the second semiconductor device 62 for applying the test enable signal TM_EN to the third semiconductor device 63 is additionally provided, descriptions for the detailed configuration and operations thereof will be omitted herein.

As is apparent from the above descriptions, according to the various embodiments, since an internal voltage is generated through trimming in a stable state in which the internal voltage reaches a preset level after an initialization period, it may be possible to prevent the internal voltage from being unstably generated.

Figure 7:
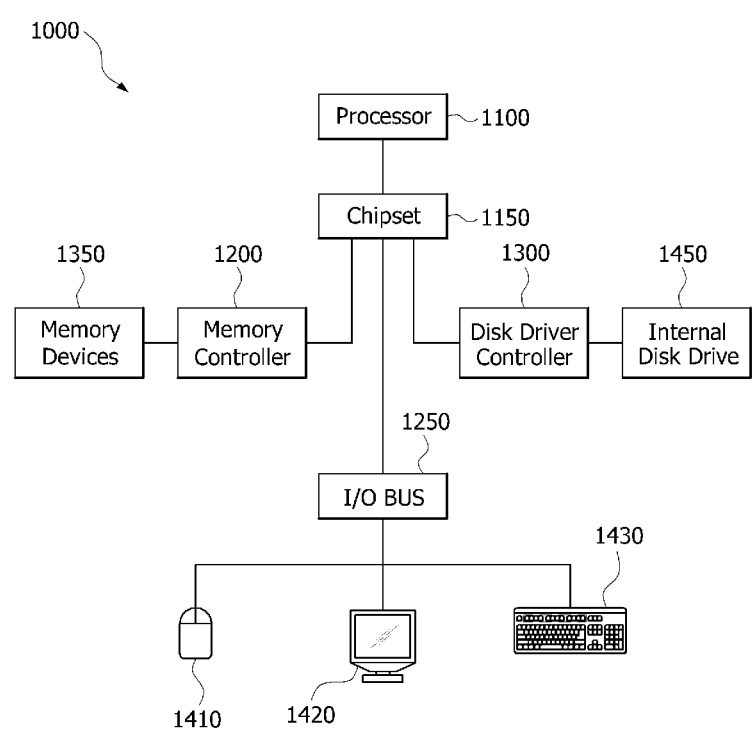
FIG. 7 illustrates a block diagram of an example of a representation of a general system employing the semiconductor device and/or semiconductor system in accordance with the embodiments discussed above with relation to FIGS. 1-6.

The semiconductor device and or semiconductor system discussed above (see FIGS. 1-6) are particular useful in the design of memory devices, processors, and computer systems. For example, referring to FIG. 7, a block diagram of a general system employing the semiconductor device and or semiconductor system in accordance with the embodiments are illustrated and generally designated by a reference numeral 1000. The general system 1000 may include one or more processors or central processing units ("CPUs") 1100. The CPU 1100 may be used individually or in combination with other CPUs. While the CPU 1100 will be referred to primarily in the singular, it will be understood by those skilled in the art that a general system with any number of physical or logical CPUs may be implemented.

A chipset 1150 may be operably coupled to the CPU 1100. The chipset 1150 is a communication pathway for signals between the CPU 1100 and other components of the general system 1000, which may include a memory controller 1200, an input/output ("I/O") bus 1250, and a disk drive controller 1300. Depending on the configuration of the general system, any one of a number of different signals may be transmitted through the chipset 1150, and those skilled in the art will appreciate that the routing of the signals throughout the general system 1000 can be readily adjusted without changing the underlying nature of the general system.

As stated above, the memory controller 1200 may be operably coupled to the chipset 1150. The memory controller 1200 may include at least one semiconductor device and or semiconductor system as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or semiconductor system as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the general system 1000 described above in relation to FIG. 7 is merely one example of a general system employing the semiconductor device and or semiconductor system as discussed above with relation to FIGS. 1-6. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the semiconductor device and the semiconductor system including the same described herein should not be limited based on the described embodiments.

What is claimed is:

1. A semiconductor device comprising:
   a control signal generation block configured to shift a level of a trimming signal and generate a selection control signal, and shift a level of a first enable signal and generate a driving control signal, when an internal voltage is raised to a level greater than a sensing reference voltage after an initialization period is ended; and
   an internal voltage generation block configured to select one of a plurality of trimming division voltages as a selected reference voltage in response to the selection control signal, and drive the internal voltage by comparing levels of the selected reference voltage and the internal voltage in response to the driving control signal.

2. The semiconductor device according to claim 1,
   wherein the trimming signal is generated by a fuse array, and whether fuses included in the fuse array are cut is set in advance to control the level of the internal voltage, and
   wherein the fuse array operates in response to a test enable signal.

3. The semiconductor device according to claim 1, wherein the first enable signal is generated when an internal operation using an internal voltage is performed.

4. The semiconductor device according to claim 3, wherein the internal operation includes an active operation, read operation, or write operation.

5. The semiconductor device according to claim 1, wherein the control signal generation block comprises:
   an internal signal generation unit configured to generate an internal trimming signal, a second enable signal, and a second reset signal in response to the test enable signal, the first enable signal and a first reset signal;
   a detection signal generation unit configured to compare the levels of the internal voltage and the sensing reference voltage, and generate a detection signal; and
   a control signal output unit configured to buffer the internal trimming signal and generate the selection control signal, and buffer the second enable signal and generate the driving control signal, in response to the detection signal and the second reset signal.

6. The semiconductor device according to claim 5, wherein the internal signal generation unit comprises:
   a trimming signal generating section configured to generate the trimming signal, the trimming signal level is set according to whether the fuses included in the fuse array are cut, in response to the test enable signal;
   a first level shifter configured to be supplied with a power supply voltage, shift the level of the trimming signal, and generate the internal trimming signal;

a second level shifter configured to be supplied with the power supply voltage, shift the level of the first enable signal, and generate the second enable signal; and a third level shifter configured to be supplied with the power supply voltage, shift a level of the first reset signal, and generate the second reset signal.

7. The semiconductor device according to claim 6, wherein the logic level of the internal trimming signal swings between the power supply voltage and a ground voltage, wherein the logic level of the second enable signal swings between the power supply voltage and the ground voltage, and wherein the logic level of the second reset signal swings between the power supply voltage and the ground voltage.

8. The semiconductor device according to claim 1, wherein the internal voltage generation block comprises:

a reference voltage trimming unit configured to generate the plurality of trimming division voltages, and select and output one of the plurality of trimming division voltages as the selected reference voltage in response to the selection control signal; and an internal voltage driving unit configured to be driven in response to the driving control signal, compare the selected reference voltage and the internal voltage, and drive the internal voltage.

9. The semiconductor device according to claim 8, wherein the reference voltage trimming unit comprises:

a first voltage dividing section configured to divide a voltage of an internal node, and generate a first divided voltage;

a first driving signal generating section configured to compare the first divided voltage and a reference voltage, and generate a first pull-up signal;

a first driving section configured to pull-up drive the internal node in response to the first pull-up signal;

a trimming division voltage generating section configured to divide the level of the internal node, and generate the plurality of trimming division voltages; and a reference voltage selecting section configured to select and output one of the plurality of trimming division voltages as the selected reference voltage, in response to the selection control signal.

10. The semiconductor device according to claim 9, wherein the internal voltage driving unit comprises:

a second voltage dividing section configured to divide the internal voltage, and generate a second divided voltage;

a second driving signal generating section configured to compare the second divided voltage and the selected reference voltage in response to the driving control signal, and generate a second pull-up signal; and a second driving section configured to pull-up drive the internal node in response to the second pull-up signal.

11. A semiconductor system comprising:

a first semiconductor device configured to output a power supply voltage and a test enable signal; and a second semiconductor device configured to be supplied with the power supply voltage, shift a level of a trimming signal and generate a selection control signal and shift a level of a first enable signal and generate a driving control signal when an internal voltage is raised to a level greater than a sensing reference voltage after an initialization period is ended, select one of a plurality of trimming division voltages as a selected reference voltage in response to the selection control signal, and compare levels of the selected reference voltage and the internal voltage in response to the driving control signal and drive the internal voltage.

12. The semiconductor system according to claim 11, wherein the trimming signal is generated by a fuse array, and whether fuses included in the fuse array are cut is set in advance to control the level of the internal voltage, and wherein the fuse array operates in response to a test enable signal.

13. The semiconductor system according to claim 11, wherein the first enable signal is generated when an internal operation using the internal voltage is performed.

14. The semiconductor system according to claim 13, wherein the internal operation includes an active operation, read operation, or write operation.

15. The semiconductor system according to claim 11, wherein the second semiconductor device comprises:

an internal signal generation unit configured to generate an internal trimming signal, a second enable signal and a second reset signal in response to the test enable signal, the first enable signal and a first reset signal;

a detection signal generation unit configured to compare the levels of the internal voltage and the sensing reference voltage, and generate a detection signal; and a control signal output unit configured to buffer the internal trimming signal and generate the selection control signal, and buffer the second enable signal and generate the driving control signal, in response to the detection signal and the second reset signal.

16. The semiconductor system according to claim 15, wherein the internal signal generation unit comprises:

a trimming signal generating section configured to generate the trimming signal, the trimming signal level is set according to whether the fuses included in the fuse array are cut, in response to the test enable signal;

a first level shifter configured to be supplied with a power supply voltage, shift the level of the trimming signal, and generate the internal trimming signal;

a second level shifter configured to be supplied with the power supply voltage, shift the level of the first enable signal, and generate the second enable signal; and a third level shifter configured to be supplied with the power supply voltage, shift a level of the first reset signal, and generate the second reset signal.

17. The semiconductor system according to claim 16, wherein the logic level of the internal trimming signal swings between the power supply voltage and a ground voltage, wherein the logic level of the second enable signal swings between the power supply voltage and the ground voltage, and wherein the logic level of the second reset signal swings between the power supply voltage and the ground voltage.

18. The semiconductor system according to claim 15, wherein the second semiconductor device further comprises:

a reference voltage trimming unit configured to generate the plurality of trimming division voltages, and select and output one of the plurality of trimming division voltages as the selected reference voltage in response to the selection control signal; and an internal voltage driving unit configured to be driven in response to the driving control signal, compare the selected reference voltage and the internal voltage, and drive the internal voltage.

19. The semiconductor system according to claim 18, wherein the reference voltage trimming unit comprises:

a first voltage dividing section configured to divide a voltage of an internal node, and generate a first divided voltage;

a first driving signal generating section configured to compare the first divided voltage and a reference voltage, and generate a first pull-up signal;

a first driving section configured to pull-up drive the internal node in response to the first pull-up signal;

a trimming division voltage generating section configured to divide the level of the internal node, and generate the plurality of trimming division voltages; and a reference voltage selecting section configured to select and output one of the plurality of trimming division voltages as the selected reference voltage, in response to the selection control signal.

20. The semiconductor system according to claim 18, wherein the internal voltage driving unit comprises:

a second voltage dividing section configured to divide the internal voltage, and generate a second divided voltage;

a second driving signal generating section configured to compare the second divided voltage and the selected reference voltage in response to the driving control signal, and generate a second pull-up signal; and a second driving section configured to pull-up drive the internal node in response to the second pull-up signal.

21. A semiconductor system comprising:

a first semiconductor device configured to output a power supply voltage;

a second semiconductor device configured to output a test enable signal; and a third semiconductor device configured to be supplied with the power supply voltage, shift a level of a trimming signal and generate a selection control signal and shift a level of a first enable signal and generate a driving control signal when an internal voltage is raised to a level greater than a sensing reference voltage after an initialization period is ended, select one of a plurality of trimming division voltages as a selected reference voltage in response to the selection control signal, and compare levels of the selected reference voltage and the internal voltage in response to the driving control signal and drive the internal voltage.

22. The semiconductor system according to claim 21, wherein the trimming signal is generated by a fuse array, and whether fuses included in the fuse array are cut is set in advance to control the level of the internal voltage, and wherein the fuse array operates in response to a test enable signal.

23. The semiconductor system according to claim 21, wherein the third semiconductor device comprises:

an internal signal generation unit configured to generate an internal trimming signal, a second enable signal and a second reset signal in response to the test enable signal, the first enable signal and a first reset signal;

a detection signal generation unit configured to compare the levels of the internal voltage and the sensing reference voltage, and generate a detection signal; and a control signal output unit configured to buffer the internal trimming signal and generate the selection control signal, and buffer the second enable signal and generate the driving control signal, in response to the detection signal and the second reset signal.

24. The semiconductor system according to claim 23, wherein the detection signal generation unit includes a sensing reference voltage generating section, the sensing reference voltage generating section configured to generate the sensing reference voltage having a stable logic level even with variations in process, voltage, and temperature.

25. The semiconductor system according to claim 23, wherein the third semiconductor device further comprises:

a reference voltage trimming unit configured to generate the plurality of trimming division voltages, and select and output one of the plurality of trimming division voltages as the selected reference voltage in response to the selection control signal; and an internal voltage driving unit configured to be driven in response to the driving control signal, compare the selected reference voltage and the internal voltage, and drive the internal voltage.

* * * * *